(12) United States Patent
Scobey et al.

(10) Patent No.: US 9,771,647 B1
(45) Date of Patent: Sep. 26, 2017

(54) CATHODE ASSEMBLIES AND SPUTTERING SYSTEMS

(76) Inventors: Michael A. Scobey, Santa Rosa, CA (US); Shaun Frank McCaffery, Healdsburg, CA (US)

( * ) Notice: Subject to any disclaimer, the term of this patent is extended or adjusted under 35 U.S.C. 154(b) by 342 days.

(21) Appl. No.: 12/630,940

(22) Filed: Dec. 4, 2009

Related U.S. Application Data

(60) Provisional application No. 61/120,646, filed on Dec. 8, 2008.

(51) Int. Cl.
    *C23C 14/34* (2006.01)
    *C23C 14/35* (2006.01)
    *H01J 37/34* (2006.01)

(52) U.S. Cl.
    CPC ............ *C23C 14/35* (2013.01); *H01J 37/345* (2013.01); *H01J 37/3408* (2013.01); *H01J 37/3411* (2013.01)

(58) Field of Classification Search
    CPC ................. H01J 37/32568; H01J 2237/032
    USPC ... 204/192.1, 192.12, 298.16, 298.19, 298.2, 204/298.23
    See application file for complete search history.

(56) References Cited

U.S. PATENT DOCUMENTS

| | | | |
|---|---|---|---|
| 4,166,018 A | 8/1979 | Chapin | |
| 4,444,643 A * | 4/1984 | Garrett | 204/298.2 |
| 4,995,958 A | 2/1991 | Anderson et al. | |
| 5,248,402 A | 9/1993 | Ballentine et al. | |
| 5,525,199 A * | 6/1996 | Scobey | 204/192.26 |
| 5,770,025 A * | 6/1998 | Kiyota | C23C 14/046 204/298.19 |
| 5,830,327 A | 11/1998 | Kolenkow | |
| 6,258,217 B1 | 7/2001 | Richards et al. | |

(Continued)

FOREIGN PATENT DOCUMENTS

| JP | 59085864 A | * | 5/1984 |
|---|---|---|---|
| JP | 02101158 A | * | 4/1990 |

(Continued)

OTHER PUBLICATIONS

Machine translation to Komuki (JP 2001-035846) published Feb. 2001.*
Translation to Nakamura (JP 59-085864) published May 1984.*

*Primary Examiner* — John Brayton
(74) *Attorney, Agent, or Firm* — Banner & Witcoff, Ltd.

(57) ABSTRACT

A cathode assembly for a magnetron sputtering system includes a target comprising sputterable material having an at least partially exposed, substantially planar sputtering or erosion surface and a target support configured to support and move the target during sputtering. In certain exemplary embodiments the cathode assembly further comprises a magnetic field source, e.g., a magnet array behind the target. The target support is configured to move the sputtering surface of the target by rotating or spinning the target in the plane of the sputtering surface, moving the target linearly back-and-forth or otherwise. The target support is configured to move the target relative to the magnetic field source, which may be stationary during sputtering, e.g., relative to the cathode assembly and vacuum chamber in which the sputtering is performed. A sputtering system including such a cathode assembly also is provided. A method of sputtering is further provided, employing such a cathode assembly.

35 Claims, 9 Drawing Sheets

(56) References Cited

U.S. PATENT DOCUMENTS

| | | |
|---|---|---|
| 7,156,961 B2 * | 1/2007 | Okatani et al. ............ 204/192.2 |
| 8,052,850 B2 * | 11/2011 | Lim et al. ................ 204/192.12 |
| 2003/0116432 A1 * | 6/2003 | Schweitzer et al. ..... 204/298.11 |
| 2004/0089535 A1 * | 5/2004 | Wolfe et al. ............. 204/192.12 |
| 2005/0139467 A1 * | 6/2005 | Takahashi ................ 204/298.23 |
| 2005/0178660 A1 * | 8/2005 | Lopp et al. ................ 204/298.2 |
| 2006/0076232 A1 * | 4/2006 | Miller et al. ............. 204/192.12 |

FOREIGN PATENT DOCUMENTS

| | | | | |
|---|---|---|---|---|
| JP | 03-006371 A | * | 1/1991 | ............ C23C 14/34 |
| JP | 2001035846 A | * | 2/2001 | |

\* cited by examiner

CATHODE ASSEMBLIES AND SPUTTERING SYSTEMS

FIELD OF THE INVENTION

The inventive subject matter disclosed herein involves a cathode assembly for a sputtering system, and in particular, a cathode assembly having a movable target. The inventive subject matter further involves sputtering systems comprising a cathode assembly having a movable target.

BACKGROUND

A sputtering process deposits a thin film of target material on a substrate by dislodging small particles or atoms from a target, which coat the substrate. Magnetic fields have been used to enhance the sputtering process. For example, as disclosed in U.S. Pat. No. 4,166,018 to Chapin, titled "Sputtering Process and Apparatus," which is incorporated herein by reference in its entirety, in a conventional vacuum sputtering process a substrate is placed in front of a sputtering cathode in a vacuum chamber. The sputtering cathode includes a substantially planar target formed of the target material. The pressure in the chamber is reduced and then, optionally, back filled with a reactive or inert sputtering gas. A negative voltage is applied to produce a plasma discharge from the target surface. The plasma discharge is intensified by magnets located behind the target to produce a closed loop magnetic field over the target surface.

Over time, the target becomes depleted. Unfortunately, uneven depletion of the target, e.g., grooving of the target surface, can adversely impact the quality of the film deposited on the substrate. It can also result in inefficient use of the target, with consequent cost penalties. One cause of uneven depletion of the target surface is that erosion is highest at regions where the magnetic field lines are tangent to the target surface. Thus, it is known in the art to rotate an array of magnets behind the target, to develop more uniform erosion of the target surface. U.S. Pat. No. 4,995,958 to Anderson et al., titled "Sputtering Apparatus with a Rotating Magnet Array having a Geometry for Specified Target Erosion Profile," U.S. Pat. No. 5,248,402 to Ballentine et al., titled "Apple-Shaped Magnetron for Sputtering System," U.S. Pat. No. 5,830,327 to Kolenkow, titled "Methods and Apparatus for Sputtering with Rotating Magnet Sputter Sources," and U.S. Pat. No. 6,258,217 to Richards et al., titled "Rotating Magnet Array and Sputter Source," each of which is incorporated herein by reference in its entirety, disclose various cathode assemblies for sputtering systems having a magnet array that rotates behind the plane of a circular flat target. It is also known to optimize the shape of the magnet array, either symmetric or asymmetric with respect to the axis of rotation, to further reduce uneven erosion of target surface.

Rotating magnet arrays create a moving deposition erosion zone at the stationary surface of the target and, correspondingly, a moving deposition plume from the surface of the target. This may result in an uneven deposition pattern on the substrate and a reduced ability to deposit precision films. This may be particularly problematic for certain sputtering processes, such as long-throw sputtering or long-throw reactive sputtering.

Further, the areas on the target that are not being eroded are subject to back coating and reactive gas poisoning. This can result in arcing and/or a reduced deposition rate. With moving magnets, it becomes problematic to cover areas of the target that are not getting eroded with shields that could prevent back-scattered coating material or reactive gases from building up a layer of undesirable material on the target surface. Typically, with moving magnets, the bigger the ratio of the target area to the magnet area, the worse these problems can become.

There is a need in the sputtering art to reduce non-uniform erosion of the target and provide improved target utilization. There is a further need to provide improved deposition rates and improved uniformity of the deposited films when depositing onto large-area substrates.

SUMMARY

In accordance with one aspect, a cathode assembly for a magnetron sputtering system comprises, in combination, a target and a target support configured to support and move the target. The target comprises a sputterable material having an at least partially exposed planar sputtering surface. In at least certain exemplary embodiments the cathode assembly further comprises a magnetic field source. The magnetic field source may comprise a magnet array. In certain exemplary embodiments such magnet array is behind the target, i.e., on the side of the target opposite the erosion or sputtering surface (those terms being used interchangeably here and in the appended claims), e.g., opposite the side that will face the substrate to be coated during use of the cathode assembly in a sputtering operation. The magnet array may, for example, be a two-dimensional array in a plane generally parallel to the planar erosion surface or planar sputtering surface of the target. Optionally, the cathode assembly also has a magnet array support configured to support the magnet array, e.g., in a stationary position during movement of the target in a vacuum chamber during sputtering. In certain exemplary embodiments the target support of the cathode assembly comprises a frame. Optionally, in embodiments having a magnet array and such frame, the magnet array may be supported within the frame behind the target.

In certain exemplary embodiments the cathode assembly further comprises a mounting surface for fixed-position mounting to a vacuum chamber to position the cathode assembly at least partially within the vacuum chamber. The target support of the cathode assemblies disclosed here typically are operative to move the target relative to the mounting surface during sputtering. In certain exemplary embodiments the planar sputtering surface of the target is circular and the target support is operative to rotate the target in a vacuum chamber during sputtering, that is, to spin the target on an axis not parallel to, e.g., generally perpendicular to, the target's planar sputtering surface. In certain exemplary embodiments the target support is operative to orbit and rotate the target in a vacuum chamber during sputtering, wherein the orbiting and rotating are in generally the same plane. It should be understood that use of the term "generally" and similar terms here and in the appended claims is intended to mean approximately or within the constraints of sensible, commercial engineering objectives, costs and capabilities. In other exemplary embodiments the target support is operative to move the target back and forth in the plane of the planar sputtering surface in a vacuum chamber during sputtering. In some embodiments the target support is operative to provide compound movement of the target, e.g., a combination of lateral and spinning movement, etc. In certain exemplary embodiments the cathode assembly is operative to dither the magnet assembly during sputtering.

In accordance with another aspect, a cathode assembly for a sputtering system includes a target support configured to support a target having a planar erosion surface. The target defines a target axis that is substantially perpendicular to the planar erosion surface of the target. The target support is configured to rotate the target around the target axis. The cathode assembly may further include a magnetic field source, wherein the target support is configured to move the target relative to the magnetic field source.

In accordance with another aspect, a cathode assembly for a sputtering system includes a target support configured to support a target having an erosion surface and a magnetic field source. The target support is configured to rotate the target around an axis that is not parallel to the erosion surface of the target. The target support is further configured to move the target relative to the magnetic field source.

In accordance with another aspect, a cathode assembly for a sputtering system having a target support and a magnet array. The magnet array includes a plurality of magnets arranged in a substantially two-dimensional planar array and defining a substantially two-dimensional magnet plane. The target support is configured to move a substantially planar target in a plane substantially parallel to the substantially two-dimensional magnet plane.

Additionally, another aspect of the present invention is directed to magnetron sputtering systems comprising a vacuum chamber, a cathode assembly in accordance with the disclosure above, mounted to the vacuum chamber, and a magnetic field source for the erosion surface. At least certain exemplary embodiments of the magnetron sputtering systems disclosed here include a vacuum chamber having a mount for a workpiece, i.e., a substrate to be coated, a cathode assembly comprising a target of sputterable material having an at least partially exposed planar sputtering surface and a target support configured to support and move the target in the vacuum chamber during sputtering, and a magnetic field source. The target support is configured to move the target relative to the chamber, and typically relative to the magnetic field produced by the magnetic field source. The target support in certain exemplary embodiments is configured to rotate the target around an axis that is not parallel to the erosion surface of the target, e.g., perpendicular to that surface. The magnetic field source may include a plurality of magnets arranged in a substantially two-dimensional array.

In at least certain exemplary embodiments of the magnetron sputtering systems disclosed here, an energy source or power source (e.g. RF, DC, pulsed DC, dual alternating cathode DC) is provided to maintain the sputtering plasma during sputtering, typically during operation of the magnetron sputtering system for deposition of material from a target onto a substrate in a vacuum chamber. It will be understood by those skilled in the art, given the benefit of this disclosure, that the magnetron sputtering systems typically will be used in a vacuum chamber. It can be mounted entirely inside or through the wall of a vacuum chamber. Typically, feedthroughs can be used to deliver power, cooling water, etc. to the magnetron sputtering systems or otherwise into the chamber. In certain exemplary embodiments cooling liquid is used for cooling the target. For example, cooling liquid lines can be used to circulate water or other cooling liquid to cool the target. In certain exemplary embodiments cooling liquid is circulated to a thermally conductive backing plate for the target, e.g., a metal plate in thermal contact with the target. Couplings along such cooling line(s) must be liquid-tight and accommodate the sliding and/or spinning movement of the target. In certain exemplary embodiments of the magnetron sputtering systems disclosed here, a power source is provided to actuate the drive mechanism to move the substantially planar sputtering surface of the target during sputtering.

Another aspect of the present invention is directed to a method for sputtering. In accordance with this aspect, magnetron sputtering methods are provided for deposition of target material on a substrate. The magnetron sputtering methods according to this aspect comprise providing a vacuum chamber with a workpiece mount for mounting a substrate within the chamber during sputtering. A cathode assembly according to the disclosure above is mounted to the vacuum chamber. A workpiece or substrate is mounted in the chamber via the workpiece mount. To sputter target material to deposit onto the substrate, the vacuum chamber is at least partially evacuated and then a sputtering gas or plasma is fed into the vacuum chamber. Power is supplied to the cathode assembly to initiate and maintain a sputtering plasma and to move the substantially planar sputtering surface of the target during sputtering. In certain exemplary embodiments the cathode assembly comprises a drive mechanism to rotate the sputtering surface, typically in the plane of the sputtering surface, e.g., about an axis that is perpendicular to the substantially planar surface of the target. In certain exemplary embodiments the drive mechanism moves the substantially planar sputtering surface of the target relative to the magnet array, which may be stationary, i.e., stationary relative to the chamber, the sputtering plume, the substrate (ignoring any spinning motion of the substrate), the workpiece mount and the like. Optionally, in addition to motion of the target's sputtering surface, the magnetic field may be in motion during sputtering, e.g., by oscillating a magnet array proving all or some of the magnetic field. The sputtering may in certain exemplary embodiments be long-throw sputtering of target material onto the substrate.

The sputtering methods disclosed here in accordance with certain exemplary embodiments include providing a cathode assembly having a magnet array and a movable target support connectable to a drive mechanism. The magnet array optionally includes a plurality of magnets arranged in a substantially planar two-dimensional array. Such methods further include providing a substrate, providing a sputtering gas, and supplying power to the cathode assembly. The movable target support is driven to move the substantially planar surface of the target relative to the substantially planar two-dimensional array of the plurality of magnets.

Those of ordinary skill in the art will recognize that the cathode assemblies and sputtering systems and methods disclosed here present significant technical and commercial advantages. Likewise, those of ordinary skill in the art will recognize that innumerable modifications can be made and other features are aspect added without departing from the principles disclosed here.

BRIEF DESCRIPTION OF THE DRAWINGS

The foregoing Summary, as well as the following Detailed Description, will be better understood when read in conjunction with the accompanying drawings.

Figure 1:
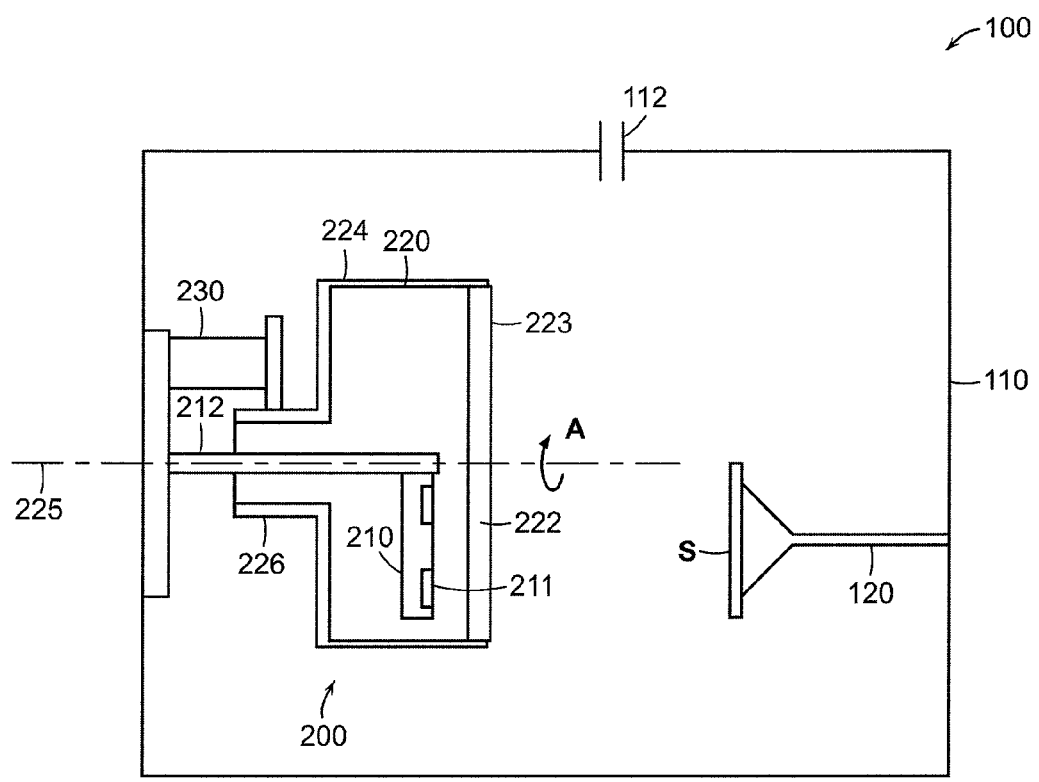
FIG. 1 is a schematic illustration of a sputtering system in accordance with certain exemplary embodiments of the present disclosure.

The figures referred to above are not drawn necessarily to scale, should be understood to provide a representation of particular aspects of the invention, and may be merely conceptual in nature and illustrative of the principles involved. Some features of the cathode assembly and sputtering system depicted in the drawings have been enlarged or distorted relative to others to facilitate explanation and understanding. The same reference numbers are used in the drawings for similar or identical components and features shown in various alternative aspects. Cathode assemblies and sputtering systems as disclosed herein would have configurations and components determined, in part, by the intended application and environment in which they are used.

DETAILED DESCRIPTION OF CERTAIN EXEMPLARY EMBODIMENTS

The basic sputtering processes are well understood for depositing target materials on substrates. The teachings presented herein with respect to cathode assemblies, magnetron sputtering systems and methods may be applied to any sputtering process and apparatus that uses magnetic fields to enhance the sputter deposition process. Further it should be understood the present disclosure contemplates that all disclosed details, including optional and alternative features and details and the like, may be used all together, in any subset, and in any operative combination or permutation.

Reference here to the disclosed cathode assemblies of the magnetron sputtering systems being mounted to or on or in a vacuum chamber should be understood to mean mounting on (i.e., wholly or partially on) the chamber, in (i.e., wholly or partially in) the chamber, to the chamber, within (i.e., wholly or partially within) the chamber, and/or the like. Thus, with the cathode assembly mounted to a vacuum chamber, certain components or portions of components or parts of the cathode assembly may be wholly or partly inside the chamber, some may extend through the wall of the chamber, some may be wholly or partly outside the chamber, etc. As disclosed above, the disclosed cathode assemblies in at least certain exemplary embodiments have a mounting surface for fixed-position mounting to a vacuum chamber. As used here, the term "fixed-position mounting to a vacuum chamber" means that, when a cathode assembly according to such embodiments are mounted to a chamber, the mounting surface of the cathode assembly is fixed or immovable relative to the main body of the chamber, e.g., relative to a chamber wall to which it is bolted or otherwise secured. As a non-limiting example, if the cathode assembly is mounted at a hole or port in the outer wall of a vacuum chamber, the mounting surface may be in fixed, surface-to-surface contact with the inner and/or outer surface of the chamber wall. Certain exemplary embodiments of the cathode assemblies disclosed here will have more than one mounting surface and optionally more than one mounting surface with fixed-position mounting to a vacuum chamber.

In typical operations employing a magnetron sputtering system comprising a cathode assembly in accordance with the present disclosure mounted to a vacuum chamber, the cathode assembly is at least partially within the vacuum chamber. The target in a typical sputtering operation will be within the vacuum chamber or in communication with the main portion of the chamber holding the substrate and, as disclosed above, will be supported for rotation or other movement during sputtering. In those embodiments having a mounting surface as discussed immediately above, the target support is operative to move the target relative to such mounting surface. In that regard, it should be understood that reference here to the target being moveably supported by the target support, and similar descriptions, such as that the target support is operative to move the target, mean that the target support is operative to move the target during sputtering, i.e., during use of the magnetron sputtering system in a sputtering operation, typically in a vacuum chamber. That is, the target support is operative to move the target relative to the plasma plume that will be created by operation of the magnetron sputtering system during sputtering, or relative to the wall(s) of the chamber, or relative to the main body of the chamber or to the main structure or superstructure of the cathode assembly, or to all of them. In typical embodiments, the superstructure of the cathode assembly is mounted to a chamber wall in fixed position to the chamber, and the target support is operative to move the target relative to the plasma plume, chamber and superstructure of the cathode assembly.

Referring now to the drawings, FIG. 1 is a schematic view of sputtering system 100 according to one non-limiting embodiment of the invention. Sputtering system 100 includes a vacuum chamber 110 having a sputtering gas inlet 112, a work piece holder 120 and a cathode assembly 200. Cathode assembly 200 and work piece holder 120 are located within vacuum chamber 110. A substrate (S) is mounted to work piece holder 120. Typically, a sputtering system also includes a vacuum pump, a power source, and one or more sputtering gas sources (not shown).

Figure 2:
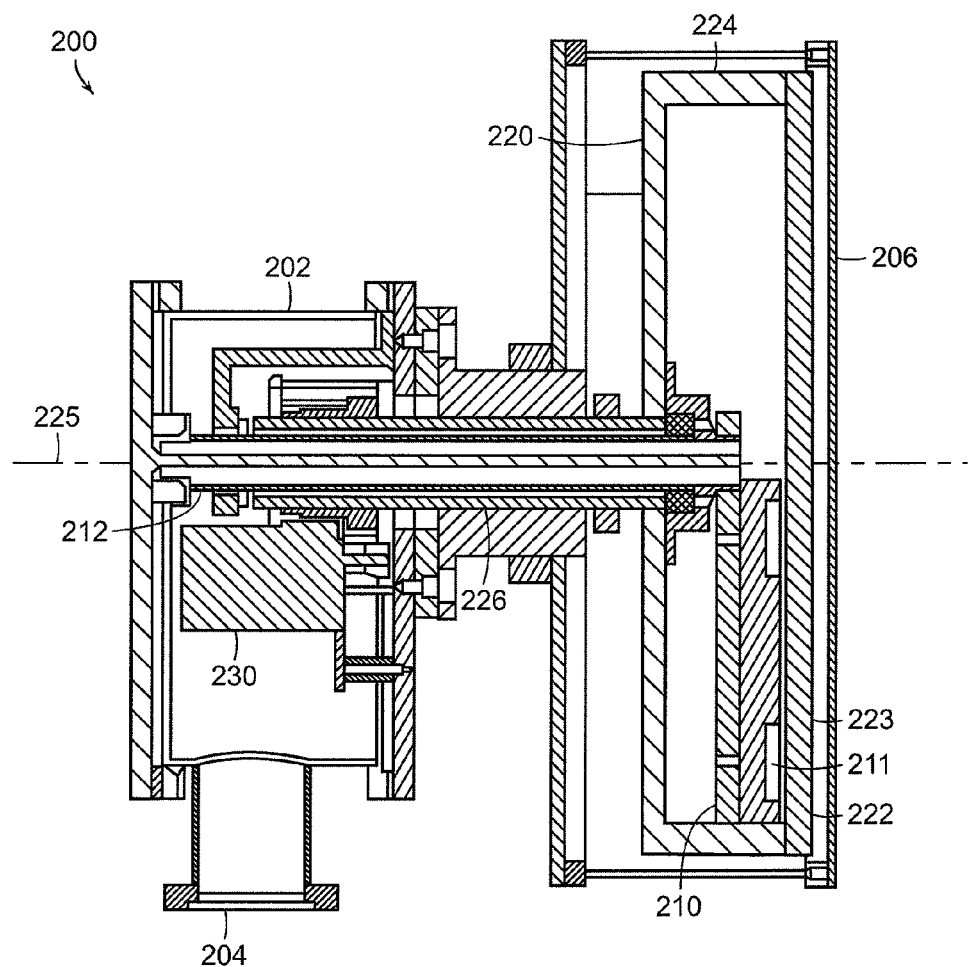
FIG. 2 is a cross-sectional side view of a cathode assembly in accordance with an exemplary embodiment of the present disclosure.
Figure 3:
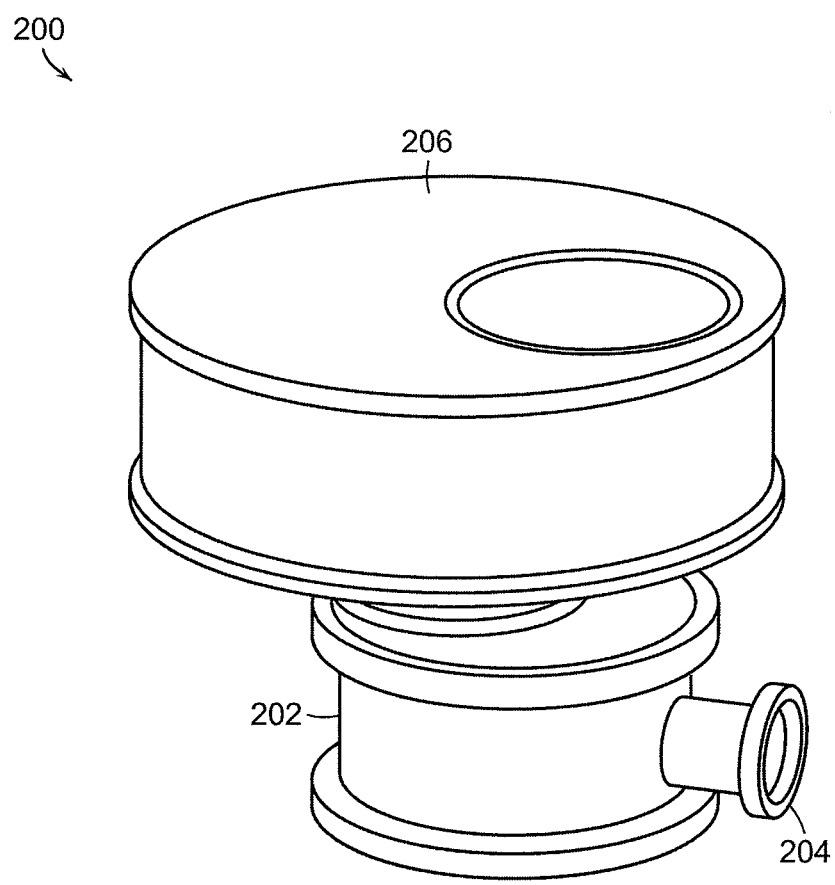
FIG. 3 is an external perspective view of a cathode assembly in accordance with the exemplary embodiment of FIG. 2.

FIG. 2 is a cross-section side view of cathode assembly 200 according to certain aspects of the invention. Cathode assembly 200 includes a magnetic field source, such as magnetic array unit 210, and a target support 220. Referring also to FIG. 3, cathode assembly 200 typically includes a housing 202, a means for cooling the cathode assembly 204 and a dark space shield 206.

As presented in FIGS. 1 and 2, target support 220 holds target 222 within a frame 224. Target 222, which may be formed of one or more target materials, is a substantially planar target having a planar top surface 223. Top surface 223 is an erosion surface that supplies the material to be deposited on substrate (S). The target material that is sputtered may comprise any suitable material as would be apparent to those of ordinary skill in the art. Target 222 may be bonded or otherwise attached to a target backing plate. Reference here to the sputtering or erosion surface of the target being planar or the like means that it is generally flat or lying in a plane. In that regard, it will be understood by those of ordinary skill in the art given the benefit of this disclosure, that the sputtering surface will, of course, not be removed perfectly evenly during sputtering and, so will develop an erosion pattern during sputtering. The sputtering surface should be understood to be planar, as that term is used here (alternatively referred to here and in the claims, either before or after such erosion pattern develops, as being generally planar), notwithstanding such erosion pattern. Target support 220 further includes a hollow shaft 226 extending between frame 224 and drive mechanism 230.

Magnetic array unit 210 can be any suitable source of magnetic field lines as would be apparent to a person of ordinary skill in the art, given the benefit of the present disclosure. According to certain exemplary embodiments of the present invention, magnetic array unit 210 includes one or more permanent magnets 211 arranged in a substantially two-dimensional array. A substantially two-dimensional array of magnets includes a plurality of magnets extending in a first direction and a plurality of magnets extending in a second direction. The array is substantially two-dimensional even if some of the magnets do not lie precisely in the plane. Further, the first and second directions may be linear or curvilinear. When the first and second directions are both linear, the two-dimensional array is planar. When at least one of the first and second directions is curvilinear, the two-dimensional array is no longer planar, but curves out of the plane. As shown in the embodiment of FIG. 2, the substantially two-dimensional array is planar, i.e. the magnets lie substantially in a flat plane. Further, the substantially two-dimensional planar array lies parallel to top surface 223 of target 222. A central shaft 212 supports magnetic array unit 210.

According to certain exemplary embodiments of the invention, as shown in FIGS. 1 and 2, magnetic array unit 210 is stationary relative to vacuum chamber 110 and target support 220 is movable relative to vacuum chamber 110. A drive mechanism 230 is drivably connected to target support 220. In operation of such embodiments, drive mechanism 230 causes shaft 226, frame 224 and target 222 to rotate around axis 225 (see arrow A in FIG. 1). Axis 225 is substantially perpendicular to the plane of planar top surface 223.

Figure 4:
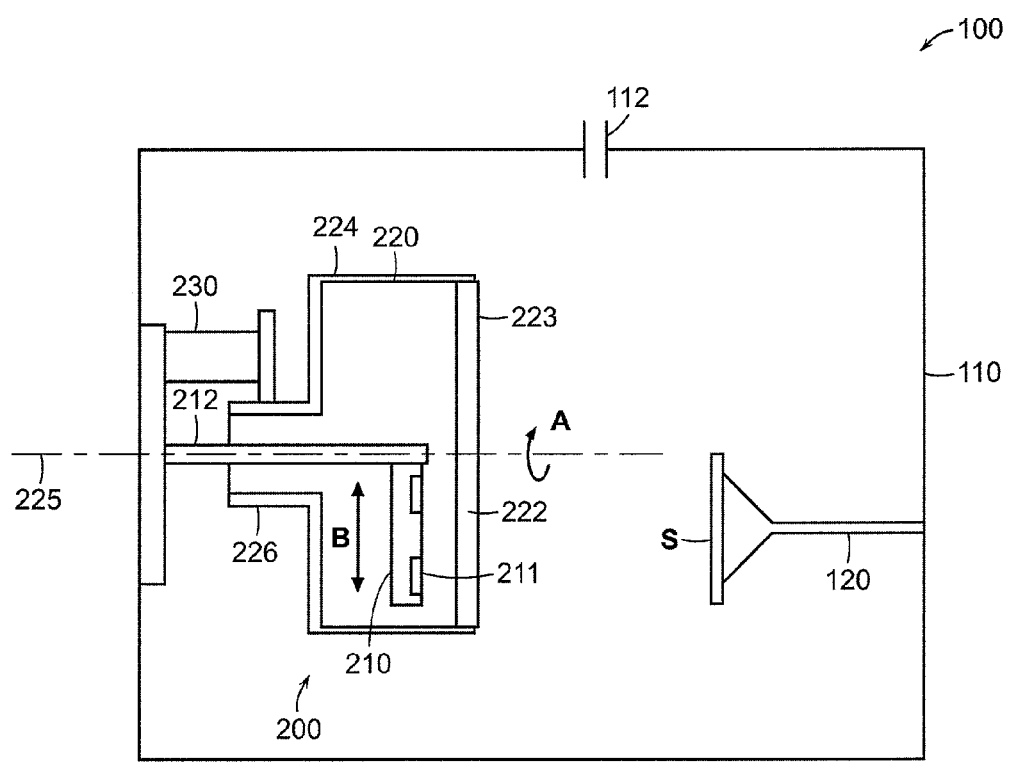
FIG. 4 is a schematic illustration of a sputtering system in accordance with other exemplary embodiments of the present disclosure.

According to certain exemplary embodiments of the invention, as shown in FIG. 4, magnet array 210 moves relative to axis 225 of target 222. As a non-limiting example, magnet array 210 may oscillate radially (back and forth in the direction of arrow B) from axis 225, in the plane of the magnetic array, using relative small displacements. This may serve to further smooth out any erosion pattern formed on erosion surface 223. As another example, magnet array 210 may move in the plane of the magnet array in an X- or Y-direction (or both an X- and Y-direction) relative to axis 225.

Figure 6:
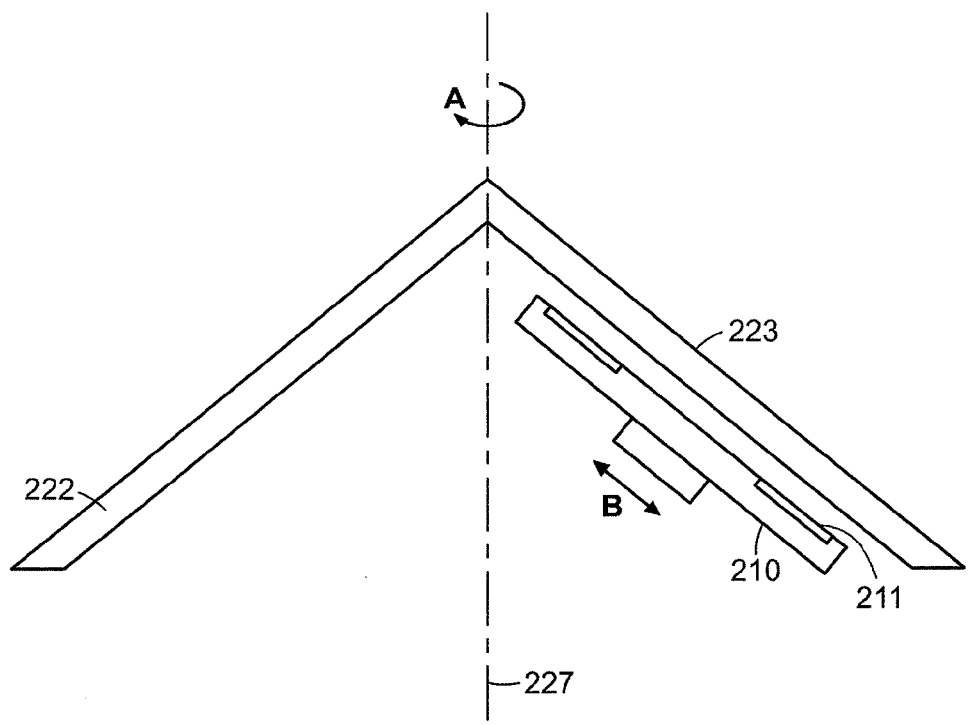
FIG. 6A is a plan view of a round or circular magnet array (that is, comprising magnets laid out in a round or circular pattern in a plane parallel to the planar sputtering surface of the target) suitable for at least certain exemplary embodiments of the cathode assemblies and sputtering systems disclosed here.
FIG. 6B is a sectional elevation taken through line A-A of FIG. 6A.
Figure 6A:
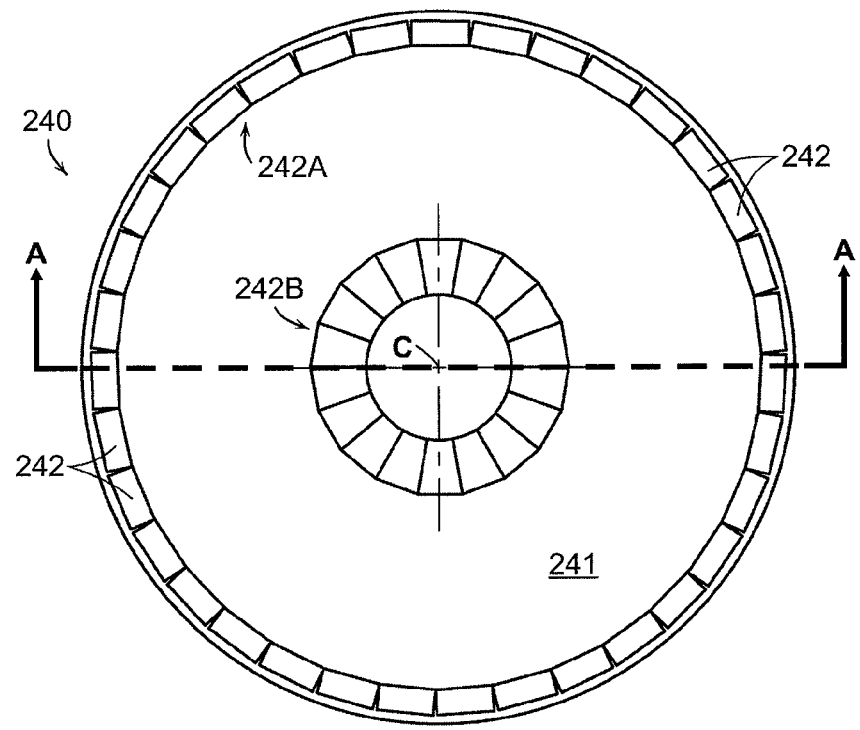
Figure 6B:
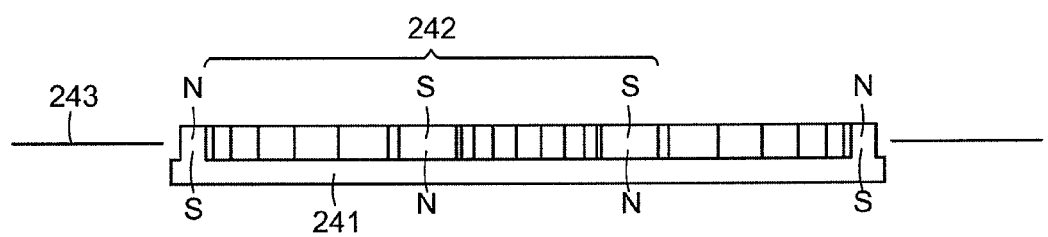

Referring now to FIGS. 6A and 6B, a round or circular magnet array is shown that is suitable for at least certain exemplary embodiments of the cathode assemblies and sputtering systems disclosed here. The magnet array 240 has magnets 242 laid out in a round or circular pattern in a plane, specifically, a plane 243 parallel to the planar sputtering surface of the target. The magnets include outer ring 242A and inner ring 242B. The magnets of both the inner and outer rings are centered about point "C" on a support plate 241.

Figure 7A:
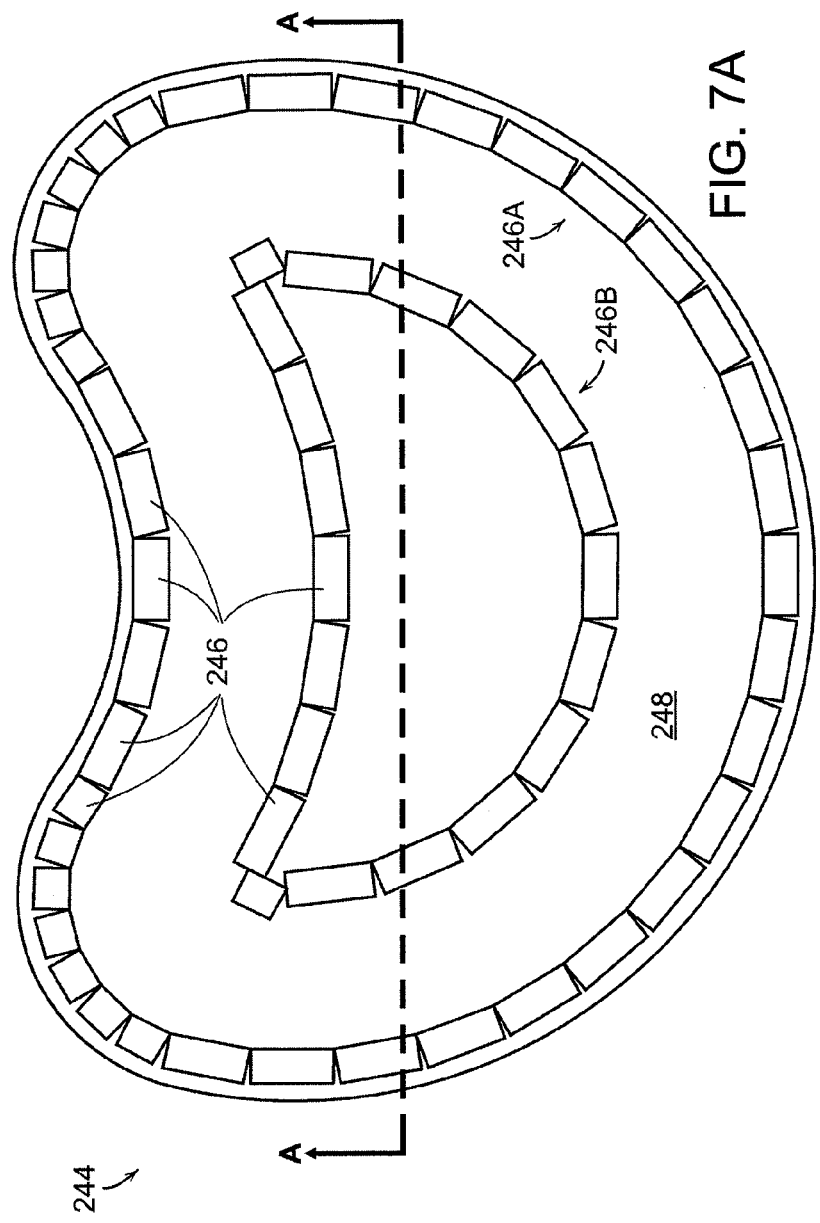
FIG. 7A is a plan view of a non-round, specifically an apple-shaped or cardioid magnet array (that is, comprising magnets laid out in a cardioid pattern in a plane parallel to the planar sputtering surface of the target) suitable for at least certain exemplary embodiments of the cathode assemblies and sputtering systems disclosed here.
Figure 7B:
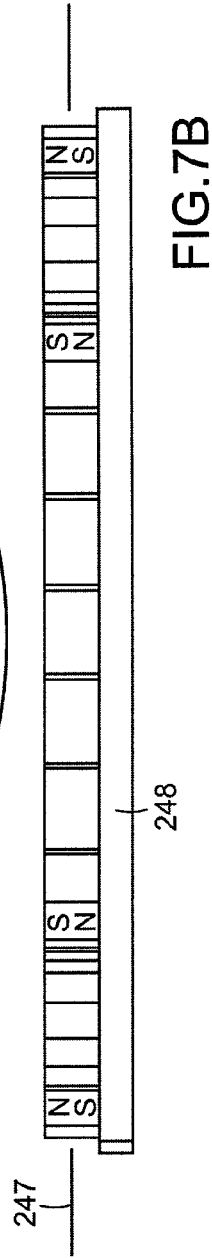
FIG. 7B is a sectional elevation taken through line A-A of FIG. 7A.

Referring now to FIGS. 7A and 7B, a non-circular magnet array 244 is shown, specifically, an apple-shaped or cardioid shaped array that is suitable for at least certain exemplary embodiments of the cathode assemblies and sputtering systems disclosed here. The magnet array 244 has magnets 246 laid out in such cardioid pattern in a plane 247 parallel to the planar sputtering surface of the target. The magnets include outer (non-circular) ring 246A and inner (non-circular) ring 246B. The magnets are positioned on a support plate 248.

Figure 5:
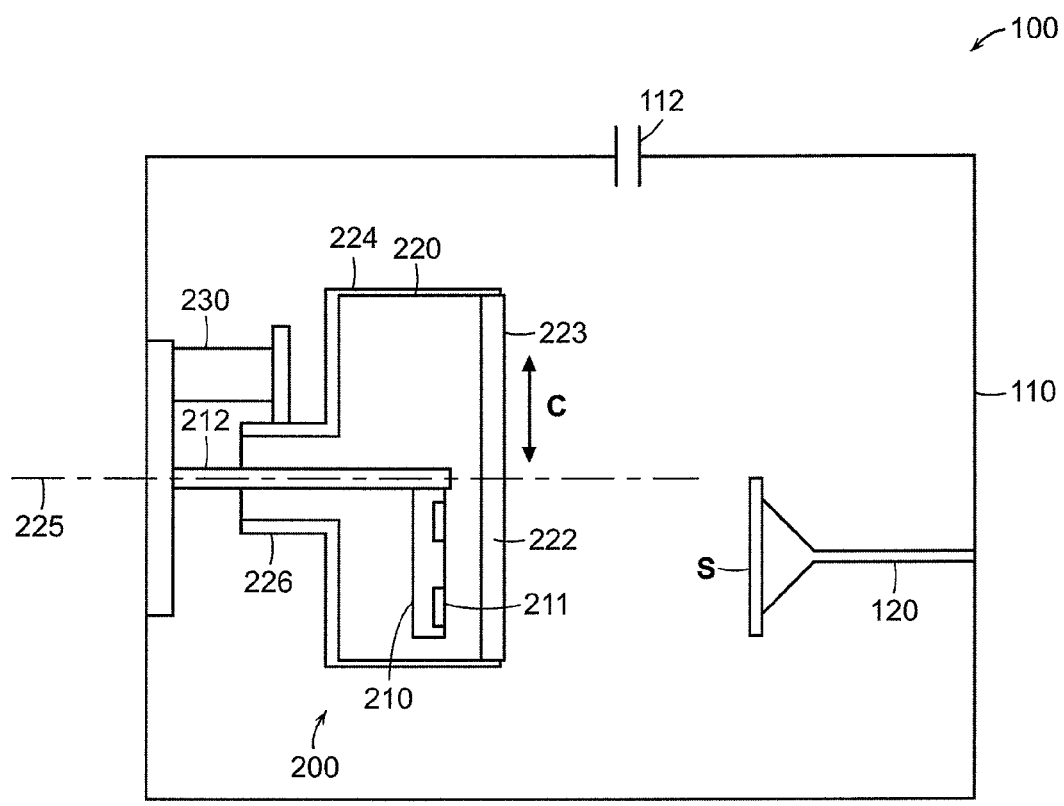
FIG. 5 is a schematic illustration of a sputtering system in accordance with even other exemplary embodiments of the present disclosure.

In yet other exemplary embodiments, as best shown in FIG. 5, target support 220 may move linearly, parallel to the plane of surface 223 (see arrow C). This may be particularly useful if the planar target is substantially rectangular or elongate. In such instance, the width dimension of target 222 may be substantially the same as the width dimension of magnetic array unit 210, while the length dimension of target 222 may be considerably longer than the length dimension of magnetic array unit 210. Thus, the rectangular or elongate target 222, may be slidably driven back-and-forth in its length direction over magnetic array unit 210 in order to develop a substantially uniform erosion profile while maintaining a stationary deposition plume. In other exemplary embodiments, target support 220 may move by a combination of movements within the plane. For example, target support 220 may move linearly in a first direction and also rotate round an axis perpendicular to the plane of top surface 223. Alternatively, target support 220 may move linearly in the plane of top surface 223 in two mutually orthogonal directions.

The sputtering processes disclosed here, according to an aspect of the invention, includes placing a cathode assembly 200 having a magnet array 210 and a target support 220 in a vacuum chamber 110. The target support 220 is connected to drive mechanism 230. The magnet array 210 includes a plurality of magnets arranged in a substantially planar two-dimensional array. Target support 220 includes a target 222 having a substantially planar erosion surface 223. A substrate, upon which material from the target is to be deposited, is placed in the vacuum chamber. A vacuum is drawn in the vacuum chamber and an inert sputtering gas, a reactive sputtering gas, or a combination of inert and reactive sputtering gases are introduced into the chamber. An electrical potential is developed across the substrate and the cathode assembly. Power is supplied to cathode assembly to drive the drive mechanism and thereby move target support 220 relative to the substantially planar two-dimensional array of the plurality of magnets of the magnet field source 210.

During sputtering, the ion density of the plasma formed will be higher in the area near magnetic array unit 210 as compared to the plasma in the area of the target remote from magnetic array unit 210. With an increased ion density, material is sputtered from the target at a higher rate. For certain applications requiring improved uniformity, the cathode assembly may be spaced a greater distance from the substrate (S), forming a "long-throw" deposition plume. The substrate may be spun about its axis to further improve uniformity. As an example of a long-throw sputtering process, cathode assembly 200 may be spaced from the substrate (S) by about 200 mm to about 350 mm in both dimensions of offset and displacement.

According to the exemplary embodiments disclosed herein, the area of the target's erosion surface can be made almost arbitrarily large. This reduces the amount of etch or erosion from each deposition cycle for any given area of the target surface. Further, large targets provide an increased inventory of target material. It is expected that the ratio of the area of the planar erosion surface of the target to the area of the footprint of the magnetic field source would typically be greater than approximately 3.0, and that the ratio could easily be greater than approximately 4.0 or 5.0.

Due to the improved erosion profile, it is expected that the utilization of the target could exceed 50% or even 60%. In certain instances, it is expected that utilization of the target in a commercially efficient sputtering operation could range from approximately 60% to approximately 85%.

Figure 8:
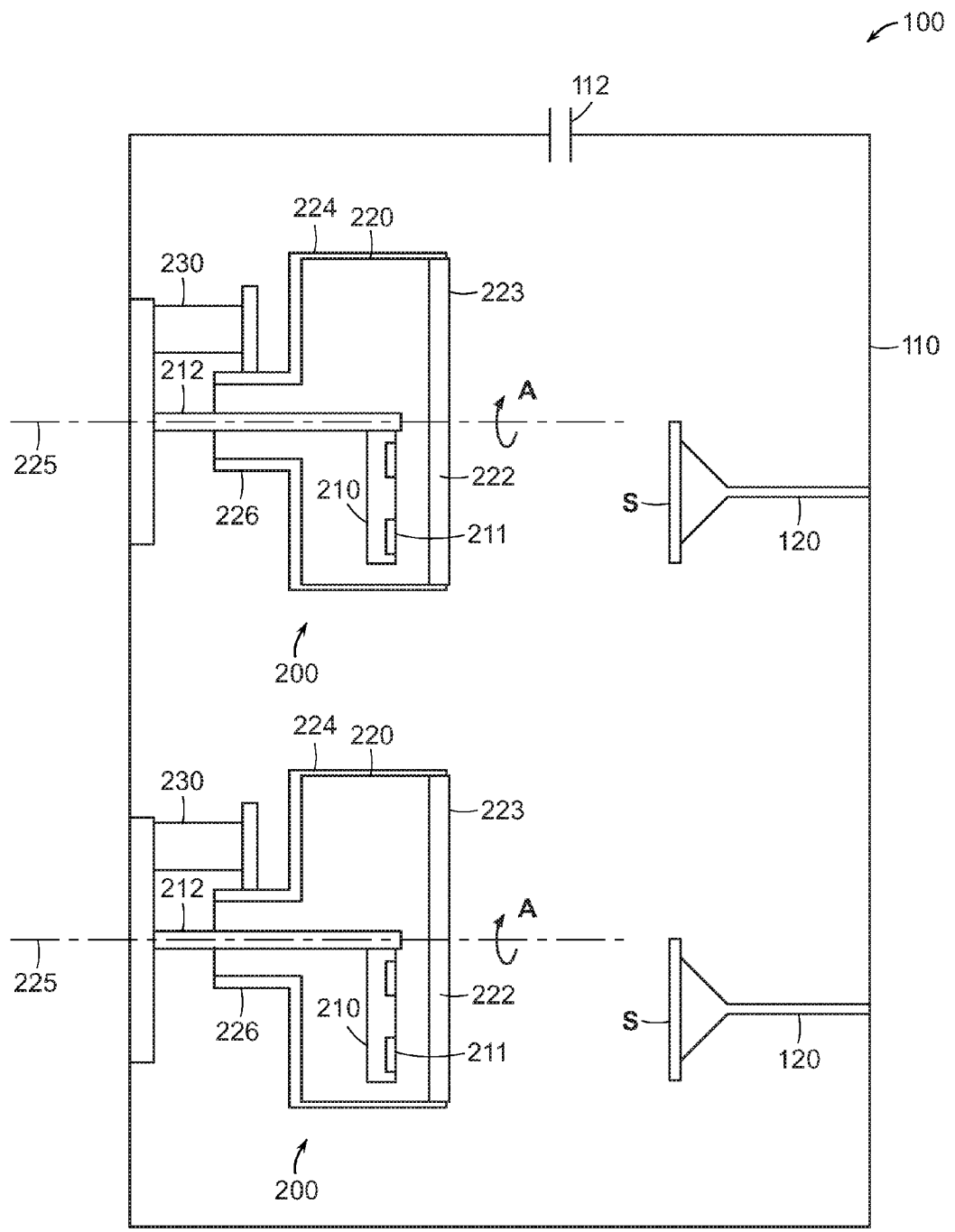
FIG. 8 is a schematic illustration of an alternative embodiment of a sputtering system with a plurality of cathode assemblies.

In the embodiment of a sputtering system schematically shown in FIG. 1, a single cathode assembly is shown. It is to be understood that a plurality of cathode assemblies may be positioned within vacuum chamber 110, as seen in FIG. 8. Further it should be understood that the cathode assembly disclosed herein may have utility in other sputtering system configurations, including those sputtering systems configured to process large area substrates.

Those of ordinary skill in the art will recognize that the sputtering systems and cathode assemblies disclosed herein present significant technical and commercial advantages. The preceding detailed description of certain exemplary embodiments was not intended to limit the scope of the disclosure to merely those exemplary embodiments, but rather to be illustrative of such scope. Further, all examples, whether demarcated by the terms "for example," "such as," "including," "etc." or other itemizing terms, are meant to be non-limiting examples, unless otherwise stated or obvious from the context of the specification. Although the present invention has been described above in terms of certain exemplary embodiments, it should be understood that other embodiments, other uses, alterations and modifications thereof will be apparent to those skilled in the art given the benefit of this disclosure, and that such modifications can be made and other features added without departing from the principles disclosed here. Thus, it will be appreciated that various modifications and alterations will be apparent from this disclosure to those skilled in the art, without departing from the spirit and scope of the invention as set forth in the following claims. Also, it is intended that the embodiments described above be interchangeable, e.g. one or more elements of any of the embodiments may be interchanged with any of the elements of any other embodiments. It is also intended that the following claims be read as covering all such alterations and modifications as fall within the true spirit and scope of the invention. It should be understood that the use of a singular indefinite or definite article (e.g., "a," "an," "the," etc.) in this disclosure and in the following claims follows the traditional approach in patents of meaning "at least one" unless in a particular instance it is quite clear from context that the term is intended in that particular instance to mean specifically one and only one. Likewise, the term "comprising" is open ended, not excluding additional items, features, components, etc.

We claim:

1. A DC magnetron reactive sputtering system comprising, in combination:
   a vacuum chamber comprising a workpiece mount for mounting a substrate within the vacuum chamber and for spinning the substrate about an axis during sputtering, and
   a plurality of cathode assemblies configured for DC reactive sputtering, each cathode assembly comprising:
       a target comprising sputterable material having an at least partially exposed planar sputtering surface,
       a target support configured to support the target in the vacuum chamber and rotate the target relative to the vacuum chamber about an axis fixed with respect to the vacuum chamber during sputtering, and
       a magnetic field source comprising a magnet array behind the target in a plane generally parallel to the planar sputtering surface, wherein the magnet array is mounted to be substantially stationary relative to the vacuum chamber during sputtering, and a central axis of the magnet array is laterally offset from the fixed axis about which the target rotates, and
   wherein the cathode assembly is configured for long-throw sputtering of target material onto the substrate, and
   wherein the axis about which the substrate spins, the axis about which the target rotates, and the central axis are all generally parallel.

2. The DC magnetron reactive sputtering system of claim 1 wherein the magnetic field source comprises a magnet array that is round or circular in the plane generally parallel to the planar sputtering surface.

3. The DC magnetron reactive sputtering system of claim 1 wherein the magnetic field source comprises a magnet array that is not round in the plane generally parallel to the planar sputtering surface.

4. The DC magnetron reactive sputtering system of claim 1 wherein the magnetic field source comprises a magnet array that is cardioid in the plane generally parallel to the planar sputtering surface.

5. The DC magnetron reactive sputtering system of claim 1 wherein the target support comprises a frame, and the magnetic field source comprises the magnet array supported within the frame.

6. A DC magnetron reactive sputtering system comprising, in combination:
   a vacuum chamber comprising a workpiece mount for mounting a substrate within the vacuum chamber and for spinning the substrate about an axis during sputtering, and
   a plurality of cathode assemblies configured for DC reactive sputtering, each cathode assembly comprising:
       a target comprising sputterable material having an at least partially exposed planar sputtering surface,
       a target support configured to support the target in the vacuum chamber and rotate the target relative to the vacuum chamber about an axis fixed with respect to the vacuum chamber during sputtering, and
       a magnetic field source having a central axis laterally offset from the fixed axis about which the target rotates, and comprising a magnet array, wherein the magnet array is operative to dither the magnet array during sputtering, and
   wherein the cathode assembly is configured for long-throw sputtering of target material onto the substrate, and
   wherein the axis about which the substrate spins, the axis about which the target rotates, and the central axis of the magnet array are all generally parallel.

7. The DC magnetron reactive sputtering system of claim 1 further comprising a mounting surface for fixed-position mounting to the vacuum chamber to position the cathode assembly at least partially within the vacuum chamber, wherein the target support is operative to move the target relative to the mounting surface.

8. The DC magnetron reactive sputtering system of claim 1 wherein the planar sputtering surface of the target is circular and the target support is operative to spin the target on an axis generally perpendicular to the planar sputtering surface in the vacuum chamber during sputtering.

9. The DC magnetron reactive sputtering system of claim 1 wherein the target support is operative to move the target back and forth in the plane of the planar sputtering surface in the vacuum chamber during sputtering.

10. The DC magnetron reactive sputtering system of claim 1 wherein the target support comprises cooling liquid lines operative to circulate cooling liquid in thermal communication with the target during sputtering.

11. The DC magnetron reactive sputtering system of claim 10 wherein the target support comprises a backing plate for the target, the backing plate being configured to receive cooling liquid from the cooling liquid lines during sputtering.

12. A DC magnetron reactive sputtering system comprising, in combination:
a vacuum chamber, and
a plurality of cathode assemblies configured for DC reactive sputtering, each cathode assembly comprising:
a target comprising sputterable material having an at least partially exposed planar sputtering surface and defining a target axis that is fixed with respect to the vacuum chamber and that is substantially perpendicular to the planar sputtering surface, and
a target support configured to support the target, and to rotate the target about the fixed target axis during sputtering, and
a magnetic field source comprising a magnet array behind the target in a plane generally parallel to the planar sputtering surface, the magnet array having a central axis and being mounted to be stationary relative to the vacuum chamber during sputtering,
wherein the cathode assembly is configured for long-throw sputtering of target material onto a substrate that spins about an axis, the axis being laterally offset from the central axis of the magnetic field source and generally parallel to the target axis and the central axis.

13. The DC magnetron reactive sputtering system of claim 12 wherein a ratio of an area of the planar sputtering surface of the target to an area of a footprint of the magnet array is greater than 3.0.

14. The DC magnetron reactive sputtering system of claim 12 wherein the magnetic field source comprises a magnet array having a plurality of magnets arranged in a substantially two-dimensional planar array.

15. The DC magnetron reactive sputtering system of claim 12 further comprising a shield covering a portion of an erosion surface of the target.

16. The DC magnetron reactive sputtering system of claim 15 wherein the magnetic field source comprises a substantially two-dimensional planar array of magnets behind the target in a plane substantially parallel to the sputtering surface of the sputterable material.

17. The DC magnetron reactive sputtering system of claim 16 wherein the shield has an opening over the erosion surface that is substantially coincidental with the substantially two-dimensional magnet array behind the target.

18. The DC magnetron reactive sputtering system of claim 17 wherein the target support is configured to rotate the target relative to the magnet array around an axis substantially perpendicular to the plane of the substantially two-dimensional magnet array.

19. The DC magnetron reactive sputtering system of claim 16 wherein the target support encloses the magnet array.

20. A DC magnetron reactive sputtering system for deposition of target material on a workpiece, comprising, in combination:
a vacuum chamber comprising a mount for a workpiece that spins about an axis fixed with respect to the vacuum chamber, and
a plurality of cathode assemblies configured for long-throw sputtering of target material onto the workpiece, each cathode assembly comprising:
a target of sputterable material having an at least partially exposed planar sputtering surface,
a target support configured to support and rotate the target about a target axis fixed with respect to the vacuum chamber during sputtering, and
a magnetic field source mounted to be stationary relative to the vacuum chamber during sputtering, having a central axis that is laterally offset from the fixed target axis,
wherein the axis about which the workpiece spins, the target axis, and the central axis are all generally parallel.

21. The DC magnetron reactive sputtering system of claim 20 for deposition of target material on a workpiece, wherein the target support is configured to rotate the target around an axis that is not parallel to the sputtering surface, thereby moving the target relative to the magnetic field source.

22. The DC magnetron reactive sputtering system of claim 20 for deposition of target material on a workpiece, wherein the magnetic field source comprises a plurality of magnets in a substantially two-dimensional magnet array.

23. A DC magnetron reactive sputtering method for deposition of target material on a substrate, comprising, in combination:
providing a vacuum chamber comprising a workpiece mount for mounting a substrate within the vacuum chamber and for spinning the substrate about an axis during sputtering;
providing a plurality of cathode assemblies mounted to the vacuum chamber and each cathode assembly comprising:
a target of sputterable material having an at least partially exposed planar sputtering surface,
a magnetic field source, and
a target support configured to support the target and comprising a drive mechanism operative to be actuated to rotate the target about a target axis fixed with respect to the vacuum chamber during sputtering, the fixed target axis being laterally offset from a central axis of the magnetic field source;
wherein each cathode assembly is configured for long-throw sputtering of target material onto the substrate;
mounting a workpiece to the workpiece mount;
at least partially evacuating the vacuum chamber and then providing a sputtering gas in the vacuum chamber; and
sputtering target material from the target onto the substrate with dual alternating cathode DC reactive sputtering, comprising
supplying power to initiate and maintain a sputtering plasma,
supplying power to actuate the drive mechanism to move the substantially planar sputtering surface of the target relative to the vacuum chamber during the sputtering,
spinning the substrate during sputtering, and maintaining the magnetic field source substantially stationary relative to the vacuum chamber during the sputtering, wherein the axis about which the substrate spins, the target axis, and the central axis are all generally parallel.

24. The DC magnetron reactive sputtering method of claim 23 for deposition of target material on a substrate, wherein the drive mechanism rotates the substantially planar sputtering surface in the plane of the sputtering surface.

25. The DC magnetron reactive sputtering method of claim 23 for deposition of target material on a substrate, wherein the drive mechanism rotates the substantially planar sputtering surface in the plane of the sputtering surface about an axis that is perpendicular to the substantially planar surface of the target.

26. The DC magnetron reactive sputtering method of claim 23 for deposition of target material on a substrate, wherein the magnetic field source comprises a magnet array and the drive mechanism moves the substantially planar sputtering surface of the target relative to the magnet array.

27. The DC magnetron reactive sputtering method of claim 26 for deposition of target material on a substrate, wherein the drive mechanism moves the substantially planar sputtering surface of the target relative to the magnet array and the vacuum chamber.

28. The DC magnetron reactive sputtering method of claim 27 for deposition of target material on a substrate, wherein the magnet array is substantially stationary relative to the vacuum chamber during sputtering.

29. The DC magnetron reactive sputtering system of claim 1 wherein the plurality of cathode assemblies includes a pair of cathode assemblies configured for dual alternating cathode DC reactive sputtering.

30. The DC magnetron reactive sputtering system of claim 12 wherein the plurality of cathode assemblies includes a pair of cathode assemblies configured for dual alternating cathode DC reactive sputtering.

31. The DC magnetron reactive sputtering system of claim 20 wherein the plurality of cathode assemblies includes a pair of cathode assemblies configured for dual alternating cathode DC reactive sputtering.

32. The DC magnetron reactive sputtering method of claim 23 wherein the plurality of cathode assemblies includes a pair of cathode assemblies configured for dual alternating cathode DC reactive sputtering.

33. The DC magnetron reactive sputtering system of claim 1 wherein a ratio of an area of a planar erosion surface of the target to an area of a footprint of the magnetic field source is greater than 3.0.

34. The DC magnetron reactive sputtering system of claim 20 wherein a ratio of an area of a planar erosion surface of the target to an area of a footprint of the magnetic field source is greater than 3.0.

35. The DC magnetron reactive sputtering method of claim 23 wherein a ration of an area of a planar erosion surface of the target to an area of a footprint of the magnetic field source is greater than 3.0.

* * * * *